United States Patent
Nyenhuis

Patent Number: 6,091,943
Date of Patent: Jul. 18, 2000

[54] COMBINING OSCILLATOR WITH A PHASE-INDEXED CONTROL CIRCUIT FOR A RADIO RECEIVER

[75] Inventor: Detlev Nyenhuis, Sibbesse, Germany

[73] Assignee: Robert Bosch GmbH, Stuttgart, Germany

[21] Appl. No.: 09/091,372

[22] PCT Filed: Dec. 9, 1996

[86] PCT No.: PCT/DK96/00517

§ 371 Date: Jun. 17, 1998

§ 102(e) Date: Jun. 17, 1998

[87] PCT Pub. No.: WO97/23957

PCT Pub. Date: Jul. 3, 1997

[30] Foreign Application Priority Data

Dec. 23, 1995 [DE] Germany ............................ 195 48 539

[51] Int. Cl.$^7$ .................................................. H04B 1/06
[52] U.S. Cl. ........................ 455/260; 455/76; 455/150.1; 375/376
[58] Field of Search .......................... 455/260, 76, 150.1, 455/255, 182.2, 188.1; 331/22, 25; 327/103, 104, 105; 375/376

[56] References Cited

U.S. PATENT DOCUMENTS

| | | | |
|---|---|---|---|
| 4,211,975 | 7/1980 | Kuroda | 455/76 |
| 4,270,206 | 5/1981 | Hughes | 455/76 |
| 4,628,270 | 12/1986 | Roberts | 375/376 |
| 4,856,085 | 8/1989 | Horvat | 331/22 |
| 5,384,551 | 1/1995 | Kennedy et al. | 455/260 |
| 5,781,044 | 7/1998 | Riley et al. | 327/105 |
| 5,949,281 | 9/1999 | Sharpe | 455/260 |

FOREIGN PATENT DOCUMENTS

195 10 220  9/1996  Germany .

*Primary Examiner*—William G. Trost
*Assistant Examiner*—Quochien B. Vuong
*Attorney, Agent, or Firm*—Kenyon & Kenyon

[57] ABSTRACT

A mixer oscillator with a phase-locked loop control loop for a radio receiver is described in which a digital loop filter in the control loop includes which an integrator for digital output signals of a phase discriminator which is preprogrammed frequency jumps. The digital loop filter includes two switchable integrators for optional alternate switching of alternate test frequencies.

9 Claims, 5 Drawing Sheets

FIG. 5

COMBINING OSCILLATOR WITH A PHASE-INDEXED CONTROL CIRCUIT FOR A RADIO RECEIVER

BACKGROUND OF THE INVENTION

In conventional radio receivers an oscillator circuit with a phase-locked control loop (PLL) which also includes an analog loop filter is used as a mixer oscillator. If a listener requires a change in the reception frequency of a radio receiver then, among other steps, the capacitors in the analog loop filter of the PLL must be recharged. The required recharging time causes the retuning of the radio receiver to seem slow, particularly during the switch-on of alternative frequencies during testing.

A mixer oscillator circuit with reduced a test time is described in German Application No. 145.102207.

ADVANTAGES OF THE INVENTION

A mixer oscillator circuit according to this invention, which differs from the background of the invention as reflected by the features cited in the characterizing, ensures an even more reduce switch-over time to a new frequency circuits. European Patent No. 0 406 469 describes a digital control circuit for a tuning system with a device for a generation of a tuner-tuning voltage. In this control circuit, the output signal of a phase discriminator is inputted to a digital integrator that is designed as a loop filter of a phase control loop, in which the inputted value to the integrator constitutes the tuning voltage after a digital/analog conversion. The integrator can be set to a value corresponding to the desired tuner-tuning voltage level for rapid switching of the tuner-tuning voltage.

In the case of greater frequency jumps, the present invention supports a brief switchover time. The present invention also provides phase discriminator with low-resolution digital output variables. In addition, the present invention provides varying means for compensating for the nonlinearity of the oscillator characteristic curve.

The present invention may further use the direct voltage component in a multiplex signal for reception tuning.

DESCRIPTION OF THE EMBODIMENT

Figure 1:
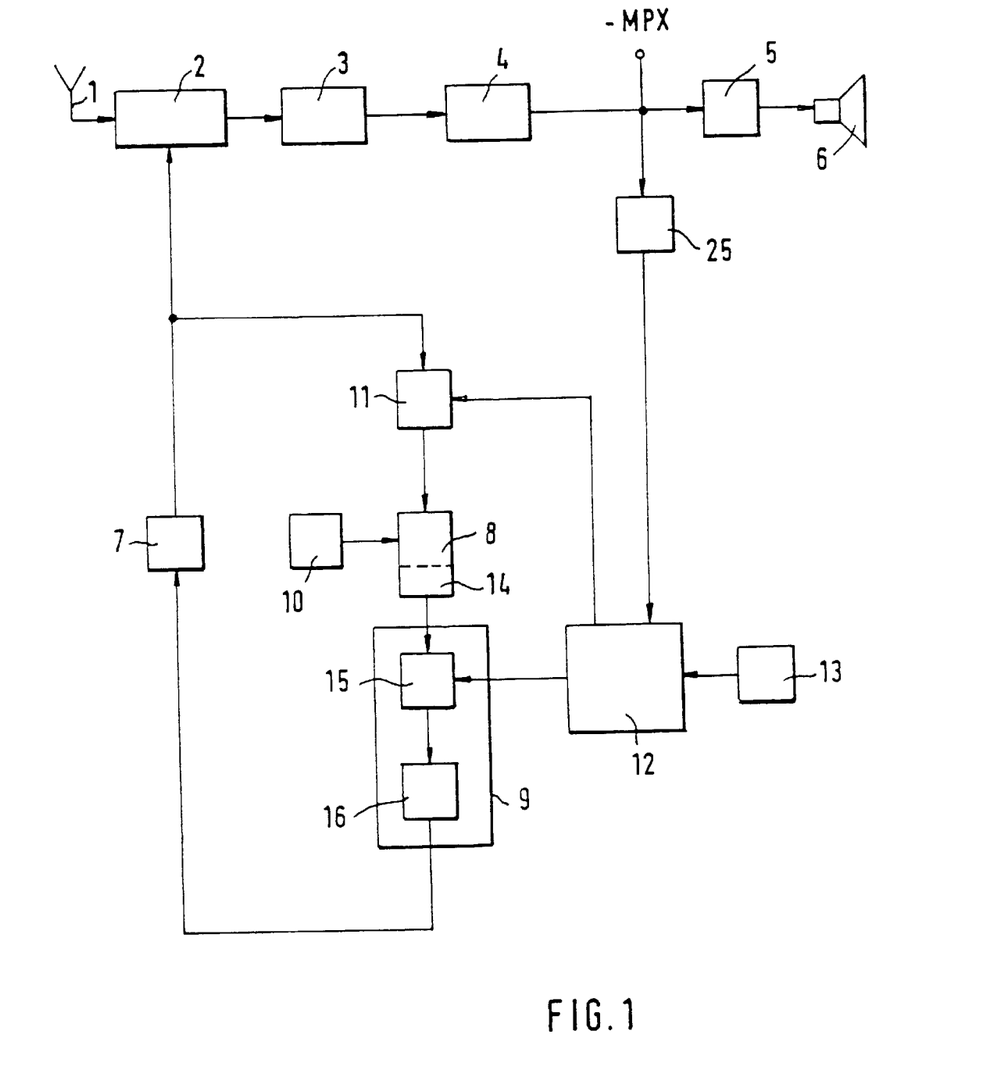
FIG. 1 shows a block diagram of a radio receiver with a mixer oscillator which is controlled by a phase-locked control loop which includes a digital loop filter.

FIG. 1 shows to the essential contact elements of a radio receiver, the components of a mixer oscillator with a phase-locked control loop.

A frequency range, within which the carrier frequency of the desired program can be found, is received via antenna 1. This carrier frequency is filtered out of the reception spectrum with the aid of a mixer stage 2 and converted into the intermediate frequency position. An intermediate frequency stage 3 whose output is connected to an FM demodulator 4 from which a multiplex signal modulating the carrier frequency can be tapped, is connected to mixer stage 2.

As is known the multiplex signal has a direct voltage component until the radio receiver is fully tuned to the carrier frequency. This direct voltage component, however, is so low that it cannot be evaluated in analog tuning circuits due to the required component tolerance levels involved.

In a low frequency stage 5 the sound signal is recovered from the multiplex signal and made audible via a loudspeaker 6. In addition, the multiplex signal contains, in the course of the reception of radio-data-signal transmitters, radio-data-signals which are modulated to a 57-kHz auxiliary carrier and evaluated within a radio-data-signal decoder 25.

The radio receiver is tuned via mixer a oscillator to the carrier frequency of the desired program. The mixer oscillator may be a voltage-controller oscillator (VCO) 7, which typically consists of the series circuit of an oscillating quartz with a varicap diode whose voltage power supply is controllable. In order to tune the radio receiver to the carrier frequency, in addition to the signal of antenna 1, the frequency of VCO 7 is fed into mixer stage 2. The mixer frequency is generally greater than the sought carrier.

The phase-locked control loop for VCO 7 includes a phase discriminator 8, a loop filter 9, and a reference oscillator 10, as well as a controllable divider 11 which is connected the input of phase discriminator 8 connected and to the output of the VCO.

With the division ratio set in divider 11, the desired value of the mixer frequency is preset, because only when the actual value of the mixer frequency agrees with the desired value—namely the carrier frequency of the desired program—does the mixer frequency which has been divided down agree with the reference frequency of reference oscillator 10. The setting of varying variables of this reference frequency within the different reception bands (VHF, SW, MW, LW) and their adjustment need not be discussed in greater detail here.

The divider ratios assigned to individual mixer frequencies are stored in a microprocessor 12 which controls divider 11. In the course of the reception of carrier frequencies within the VHF band, the divider ratio is generally of a magnitude of several thousand.

The mixer frequency which has been divided down is compared in phase discriminator 8 with the frequency of reference oscillator 10 on the basis of their respective frequency position and phase positions. In the course of the comparison, a control voltage arises at the output of phase discriminator 8 which readjusts VCO 7 so that the oscillations of both oscillators 7 and 10 have the same frequency and phase.

Loop filter 9, series-connected downstream from phase discriminator 8, suppresses higher frequency spectral components within the control voltage.

If the receiver is to be set to the reception of a specific new program, then an assigned program sequence can be triggered within microprocessor 12 via a station button 13. This control program causes, among other thing, a change in the divider ratio within divider 11. Phase discriminator 8 responds to a new setting of divider 11 with a change in its digital output signal, or within an analog/digital converter, its digitized output signal. The new numerical value of the output signal is stored in digital loop filter 9 in integrator 15. The new content of integrator 15 is converted within a digital/analog converter 16 into a changed control voltage for VCO 7 which now provides a correspondingly changed mixer frequency. This control process ends when the mixer frequency has been set to the value required for the reception of the new program.

With the new digital loop filter 9, comprising integrator 15 and digital/analog converter 16, provide in the phase-locked loop, the setting process requires considerably less time than with the use of an analog loop filter, because the capacitor recharging time required in corresponding networks with each new setting of the frequency is now eliminated. What is now decisive is the clock time of the digital circuit.

The time required for setting the mixer oscillator to a preprogrammed new mixer frequency can be further reduced has an input into which an additional numerical value can be fed in addition to the numerical value of the digital output of phase discriminator 8. For the feed-in of this additional numerical FIG. 1 show a typical example in which, the integrator 15 has with a second input which is connected to microprocessor 12.

The additional numerical value serves the following purpose. When the new frequency to be set is known, not only is the divider ratio to be set in frequency divider 11 known, but the required control voltage for the VCO 7 is also known. This control voltage arises in the new loop filter 9 at the output of digital/analog converter 16 and is determined by the content of series-connected integrator 15. Consequently, with a knowledge of the required control voltage, the assigned numerical value for the integrator 15 is also known.

With the resetting of the divider ratio in divider 11 via microprocessor 12, a numerical value corresponding to the level of the new control voltage is fed by microprocessor 12 into integrator 15, thus pulling VCO 7 more rapidly to the new mixer frequency.

The additional feeding of a numerical value into integrator 15 can be illustrated by a numerical example. A frequency of 87.5 MHZ (+IF), which constitutes the lower limit of the VHF band, is assigned a control voltage of 1.8 V at the output of VCO 7, while a frequency of 108 MHZ (+IF), which constitutes the upper limit of the VHF band, requires a voltage of 6.3 V. When digital/analog converter 16 is, for example, ten bits wide at the output of digital loop filter 8, then the required voltage range of (6.3 V–1.8 V)=4.5 V is subdivided into 1,024 different numerical values. Each numerical value corresponds to another mixer frequency. If the mixer frequency, for example, is supposed to jump back from the upper end of the VHF band to the lower end, then for this jump the microprocessor will cause a discharge of integrator 15 from 1,024 to 0, in addition to a corresponding change in the divider ratio in divider 11.

Thus, a preprogrammed automatic resetting of a transmitter with the aid of a chargeable digital loop filter can be accomplished within a an even shorter period of time than in the previous embodiment.

Phase discriminator 8 subsequently only provides an output signal which corresponds to the residual deviation between its two input oscillations. This residual deviation can be caused by a still existing phase-shift of the instantaneous mixer frequency from the desired frequency, because, due to the high divider ratio prevailing a deviation in frequency of the divided down mixer frequency from the reference frequency result in to a remaining phase deviation within the mixer frequency even with a proper frequency position. In addition fluctuations can also cause residual deviation.

Since the digital loop filter contains no capacitors, there can be no appreciable change, once achieved, in the control voltage of VCO 7 due to capacitor discharges caused by leakage current; thus the readjustment processes case of the use of a digital loop filter are reduced.

A digital loop filter can be used particularly advantageously when an alternative frequency to the set reception frequency is to be set for testing purposes. Such alternative frequencies are known to be transmitted via radio data signals within the receiver. These tests in and of themselves are known.

Figure 2:
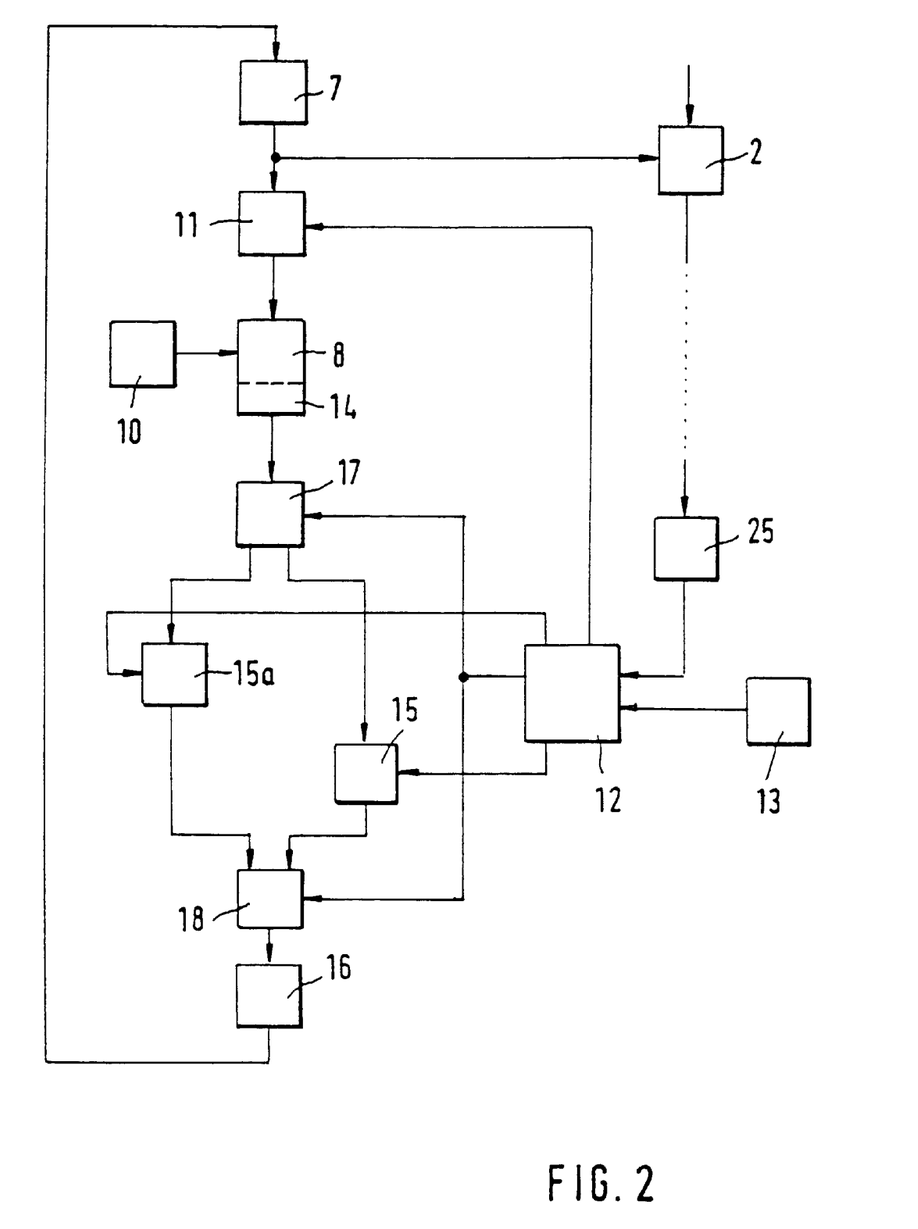
FIG. 2 shows a block diagram of a radio receiver with two switchable digital loop filters in the control loop of the mixer oscillator.

FIG. 2 shows an embodiment which may be used perform such a test, in which the phase-locked control loop has two integrators 15 and 15a which can be optionally switched into the effective loop filter circuit via transfer switches 17, 18 which are synchronously controlled by microprocessor 12. Prior to switchover a the second integrator 15a is precharged by microprocessor 12 to the numerical value corresponding to the alternative frequency. In the course of a actual a switchover only the divider ratio in divider 11 is changed. The required numerical value is determined from the data on the alternative frequency data of the transmitter that has been set, acquired from radio-data-signal decoder 25 and from the numerical value stored in microprocessor 12, to which the alternative frequency, in addition to the divider ratio of divider 11, is assigned.

If, after switchover, testing shows that the transmitter with the alternative frequency has a poorer reception value than the previously set transmitter, then transfer switches 17 and 18 are switched back, with the old content in the first integrator 15 at which VCO 7 having already been in-phase tuned to the carrier frequency again being available, thus eliminating the time required for achieving the proper mixer frequency in the return stage when switching to the alternative frequency.

Figure 3:
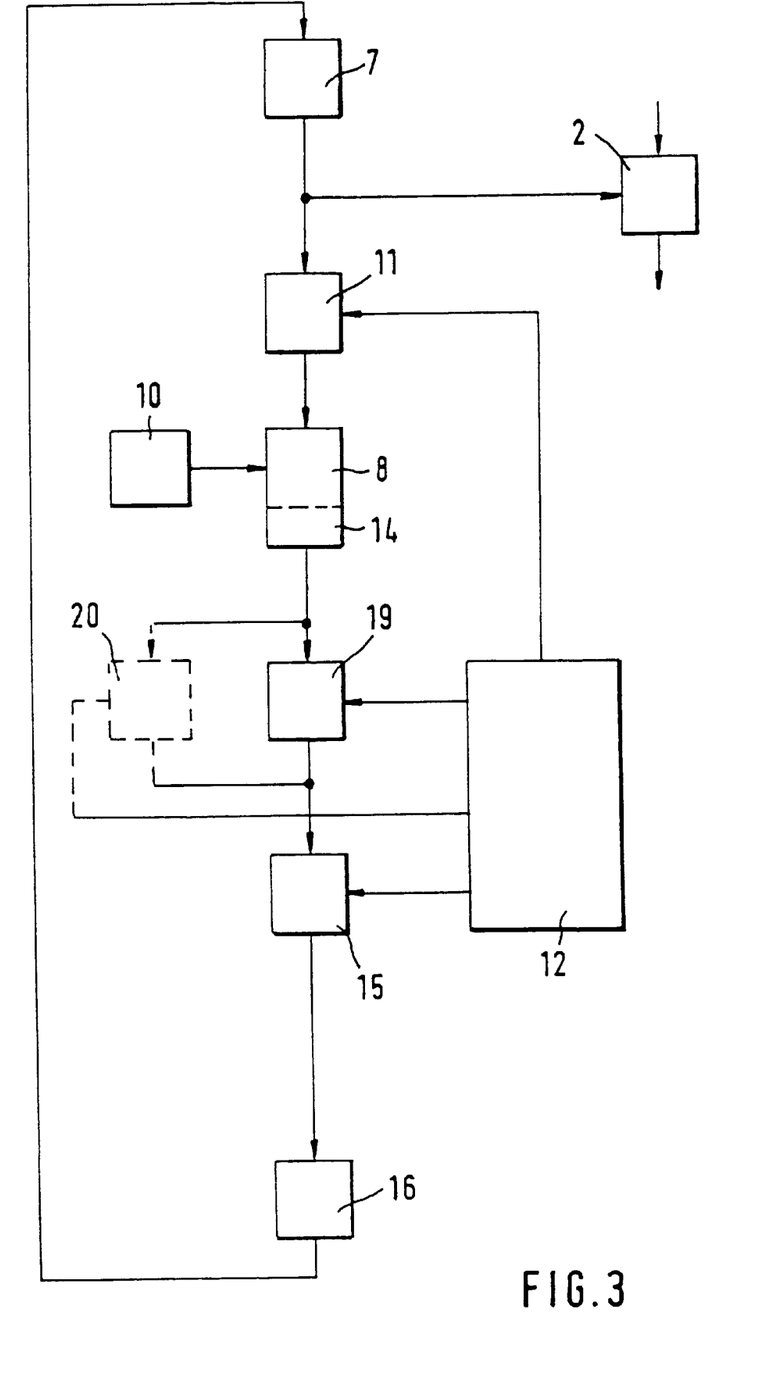
FIG. 3 shows a block diagram of a control loop with an additional circuit for the iterative approximation of the actual frequency to the desired frequency.

When using phase discriminators with low digital resolution of the output signal, such as with 1-bit or 2-bit-long data words, as shown in FIG. 3, a circuit 19 for the iterative approximation of the mixer frequency at the desired frequency can be looped-in between the output of phase discriminator 8 and the input of integrator 15. Circuit 19 is so designed that after a change in frequency the circuit 19 initially generates a greater numerical value and feeds that greater value into integrator 15. Subsequently, integrator 15 may be fed half as great a value, and if necessary, a value having a change in sign. This numerical value of decreasing magnitude is added in a clocked manner within integrator 15 to the existing integrator content or subtracted from the existing integrator content, thus resulting iteratively via the D/A converter 16 in the required level of control voltage for VCO 7 for retuning of the receiver.

It is known to those skilled in the art that the characteristic curve of a VCO 7 is not linear, that is, a change in voltage of 0.25 V results in less of a change in frequency at the upper end of the VHF band than at the lower end. Linearization of the characteristic curve can be achieved by means of a circuit 20 located upstream from the input of integrator 15 instead of circuit 19. Circuit 20 varies the digital or digitized output signal of phase discriminator 8 as a function of the instantaneous position of the mixer frequency within the reception range. Thus, circuit 20 typically increases the output signal at the upper end of the VHF band and reduces the output signal at the lower end. Circuit 20 in correspondence with the position of the mixer frequency is typically controlled via microprocessor 12.

When using circuit 19 for iterative approximation of the actual frequency to the desired frequency, it is expedient to combine the process of iteration with the process of variation described above so that the numerical values of the individual steps of iteration depend upon the position of the mixer frequency and are less at the lower end of the band than at the upper end of the VHF band.

Figure 4:
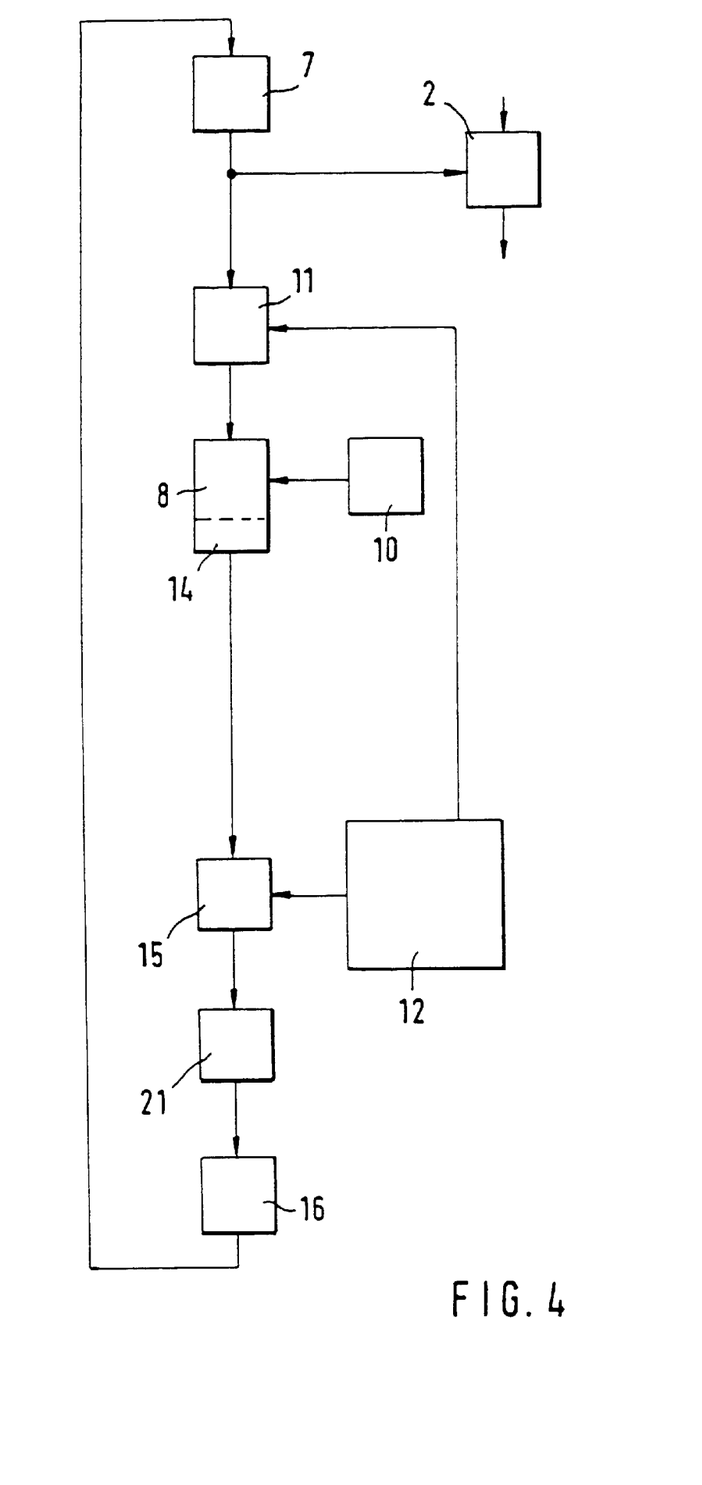
FIG. 4 shows the block diagram of a control loop with an additional circuit for the polynomial calculation of the inverse Voltage Controlled Oscillator characteristic curve.

In order to achieve the same change in frequency in each frequency range with the same difference in the numerical values, an embodiment of the invention, shown in FIG. Provides a circuit 21 for the inversion of the oscillator characteristic curve by means of a polynomial calculation which is looped in between the output of integrator 15 and the input of D/A converter 16. This circuit 21 constitutes an alternative to circuit 20 shown in FIG. 3.

Figure 5:
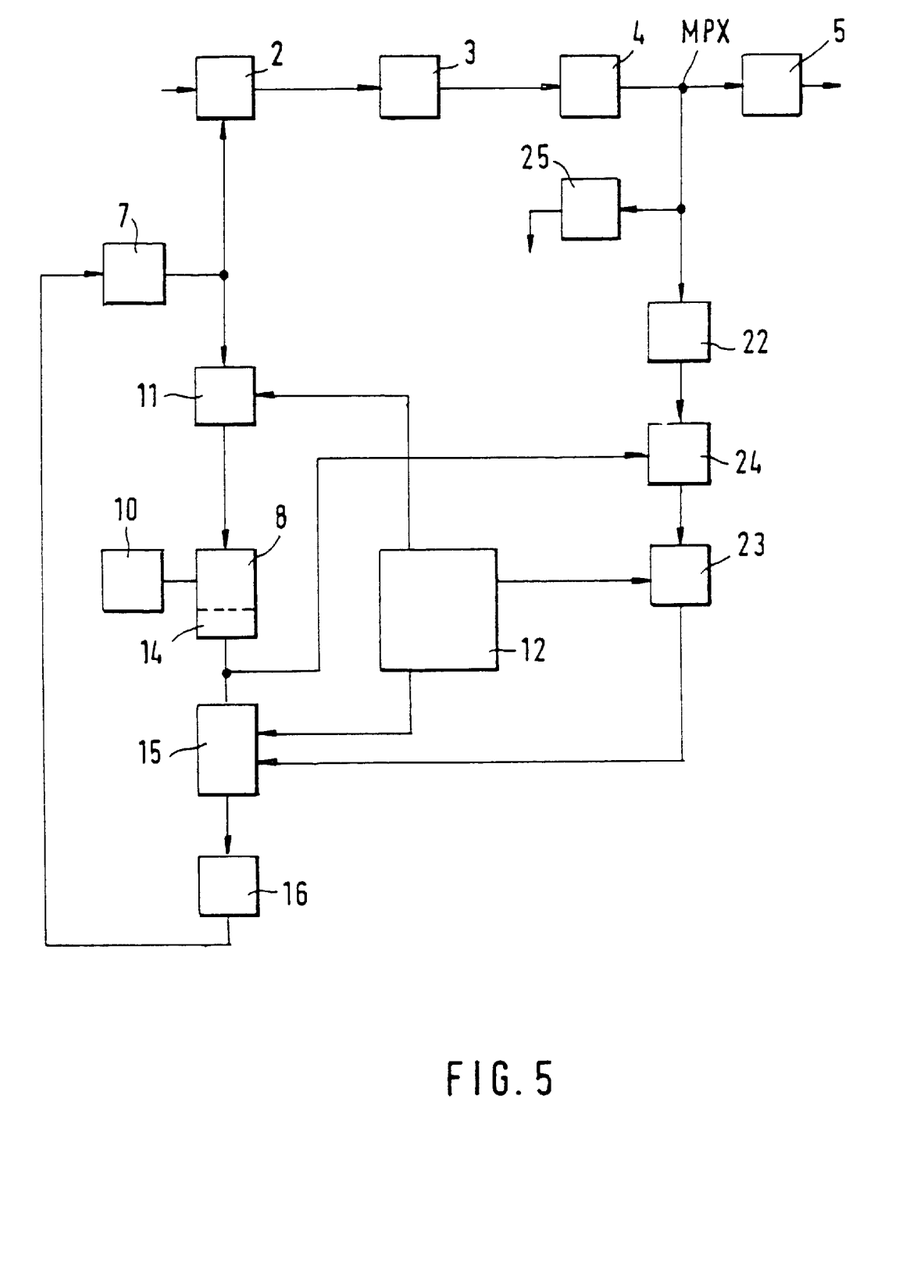
FIG. 5 shows a block diagram of a control loop in which a direct-voltage component in a multiplex signal is evaluated.

In the case of a high digital resolution of the content of integrator 15 discussed above, an aspect of tuning the radio receiver can be brought into consideration which, in the case of analog loop filters, has not, been able to be used in conventional devices because of the required component tolerance level involved. As previously mentioned, a direct voltage component remains within the multiplex signal tappable at the output of FM demodulator 4 when there is an imprecise an tuning of the mixer oscillator. When this voltage is converted to a numerical value in analog/digital converter 23, then the microprocessor program can additionally change the content of the integrator 15 using this value. To this end loop filter 9 has a third control input for integrator 15. For purposes of expediency this control input is only opened by the microprocessor program via gate circuit 24 for the reception of this additional tuning value when phase discriminator 8 displays agreement between the two input frequencies in terms of frequency and phase.

I claim:

1. A mixer oscillator for a radio receiver having a phase-locked loop control loop, comprising:
   a voltage-controlled oscillator;
   a phase discriminator;
   a first integrator storing at least one of a digital output variable and a digitized output variable of the phase discriminator;
   a second integrator storing a value different from the at least one of the digital output variable and the digitized output variable; and
   a digital/analog converter converting a content of the first integrator into a control voltage for the voltage-controlled oscillator,
wherein at least one of the first integrator and the second integrator is switched into the phase-locked loop control loop to alternate between a first reception frequency and a second reception frequency.

2. The mixer oscillator according to claim 1, further comprising two synchronously-controlled transfer switches, the two transfer switches switching the at least one of the first integrator and the second integrator into the phase-locked loop control loop.

3. The mixer oscillator according to claim 1, further comprising:
   a microprocessor,
wherein the voltage-controlled oscillator generates a mixer frequency, wherein the microprocessor selects a predetermined value for the mixer frequency, and wherein the microprocessor inputs a numerical value assigned to the predetermined value of the mixer frequency into the first integrator to change a frequency of the radio receiver.

4. The mixer oscillator according to claim 3, wherein the first integrator includes a first input to receive the at least one of the digital output variable and the digitized output variable from the phase discriminator and a second input for receiving the numerical value assigned to the predetermined value of the mixer frequency from the microprocessor.

5. The mixer oscillator according to claim 1, further comprising:
   a feeder circuit providing a plurality of decreasing numerical values to the first integrator for an iterative approximation of a frequency of the mixer oscillator to a predetermined value,
wherein the at least one of the digital output variable and the digitized output variable of the phase discriminator includes a low-resolution phase digital output variable, wherein the feeder circuit changes a sign of at least one of the plurality of decreasing numerical values at predefined instances.

6. The mixer oscillator according to claim 1, further comprising a compensation circuit coupled to the first integrator and varying the at least one of the digital output variable and the digitized output variable of the phase discriminator as a function of a frequency position of the voltage-controlled oscillator to compensate for a nonlinearity of an oscillator characteristic curve.

7. The mixer oscillator according to claim 1, further comprising a calculation circuit performing a polynomial calculation of an inverse oscillator characteristic curve and coupled between an output of the first integrator and an input of the digital/analog converter.

8. The mixer oscillator according to claim 1, further comprising a detector monitoring a direct-voltage component in a multiplex signal of the radio receiver, wherein an output of the detector is coupled to a control input of the first integrator via an analog/digital converter at predefined instances.

9. The mixer oscillator according to claim 8, further comprising a gate circuit coupled between the output of the detector and the control input of the first integrator, the gate circuit allowing a connection between the detector and the first integrator when the phase discriminator signals an agreement between a first input frequency and a second input frequency.

* * * * *

UNITED STATES PATENT AND TRADEMARK OFFICE
CERTIFICATE OF CORRECTION

PATENT NO. : 6,091,943
DATED : July 18, 2000
INVENTOR(S) : Detlev Nyenhuis

It is certified that error appears in the above-identified patent and that said Letters Patent is hereby corrected as shown below:

Title page,
Item [57] ABSTRACT,
Line 3, change "... includes which ..." to -- which includes --.

Column 1,
Line 17, insert:
-- European Patent No. 0 406 469 describes a digital control circuit for a tuning system with a device for a generation of a tuner-turning voltage. In this control circuit, the output signal of a phase discriminator is inputted to a digital integrator that is designed as a loop filter of a phase control loop, in which the inputted value to the integrator constitutes the tuning voltage after a digital/analog conversion. The integrator can be set to a value corresponding to the desired tuner-tuning voltage level for rapid switching of the tuner-tuning voltage. --.

Column 1,
Line 18, change "ADVANTAGES OF THE INVENTION" to -- SUMMARY OF THE INVENTION --.
Line 20, change "... this ..." to -- the present --.
Lines 24-33, delete beginning with "European Patent No. ...".
Line 36, change "... discriminator ..." to -- discriminators --.
Line 44, change "... DRAWING" to -- DRAWINGS --.
Line 47, change "... filter," to -- filter. --.
Line 50, change "... oscillator," to -- oscillator. --.
Line 53, change "... frequency," to -- frequency. --.
Line 57, change "... curve," to -- curve. --.
Line 61, change "DESCRIPTION OF THE EMBODIMENT" to -- DETAILED DESCRIPTION OF THE INVENTION --.
Line 62, delete "... to ...".
Line 64, after "... receiver," insert -- and --.

Column 2,
Line 19, change "... mixer a ..." to -- a mixer --.
Line 25, insert a space between "... frequency," and "in ...".
Line 27, after "... carrier" insert -- frequency by the magnitude of the intermediate frequency. --.
Line 32, after "connected ..." to -- connected to --.
Line 52, change "... position ..." to -- positions --.
Line 63, change "... thing, ... " to -- things, --.

UNITED STATES PATENT AND TRADEMARK OFFICE
CERTIFICATE OF CORRECTION

PATENT NO. : 6,091,943
DATED : July 18, 2000
INVENTOR(S) : Detlev Nyenhuis

It is certified that error appears in the above-identified patent and that said Letters Patent is hereby corrected as shown below:

Column 3,
Line 9, change "... provide ..." to -- provided --.
Line 16, after "... reduced" insert -- by providing a digital loop filter 9 which --.
Line 20, change "numerical FIG. 1 show ..." to -- numerical values, FIG. 1 shows --.
Line 63, change "... divided down ..." to -- divided-down --.
Line 64, change "... result in to a ..." to -- results in a --.
Line 66, change "... In addition fluctuations ..." to -- In addition, temperature fluctuations --.

Column 4,
Line 4, change "... case of the use of a ..." to -- are reduced by using the --.
Line 5, change "... are reduced" to -- 9 --.
Line 6, delete "... particularly ...".
Line 12, change "... used ..." to -- used to --.
Line 19, change "... actual a ..." to -- actual --.

Column 5,
Line 8, change "... an embodiment of the invention, shown in FIG." to -- FIG. 4 shows an alternative embodiment of the present invention --.
Line 9, change "Provides .:." to -- provides --.
Line 14, change "... content ..." to -- contents --.
Line 17, change "... not, ..." to -- not --.
Line 22, delete "... an ...".
Line 23, change "... is converted ..." to -- is monitored by a detector 22 and is converted --.

Signed and Sealed this

Twenty-ninth Day of January, 2002

*Attest:*

*Attesting Officer*

JAMES E. ROGAN
*Director of the United States Patent and Trademark Office*